(12) United States Patent
Zhang

(10) Patent No.: US 7,388,284 B1
(45) Date of Patent: Jun. 17, 2008

(54) INTEGRATED CIRCUIT PACKAGE AND METHOD OF ATTACHING A LID TO A SUBSTRATE OF AN INTEGRATED CIRCUIT

(75) Inventor: Leilei Zhang, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/250,943

(22) Filed: Oct. 14, 2005

(51) Int. Cl.
*H01L 23/06* (2006.01)

(52) U.S. Cl. .................... 257/704; 257/684; 257/728

(58) Field of Classification Search ............... None
See application file for complete search history.

(56) References Cited

U.S. PATENT DOCUMENTS

| | | | |
|---|---|---|---|
| 3,846,824 A | 11/1974 | Bell | |
| 5,105,529 A | 4/1992 | McShane et al. | |
| 5,406,117 A | 4/1995 | Dlugokecki et al. | |
| 5,434,745 A | 7/1995 | Shokrgozar et al. | |
| 5,436,407 A | 7/1995 | Fehr et al. | |
| 5,455,456 A * | 10/1995 | Newman | 257/704 |
| 5,889,323 A | 3/1999 | Tachibana | |
| 5,895,233 A | 4/1999 | Higashi et al. | |
| 5,949,655 A | 9/1999 | Glenn et al. | |
| 5,998,862 A | 12/1999 | Yamanaka | |
| 6,016,006 A | 1/2000 | Kolman et al. | |
| 6,037,193 A | 3/2000 | Interrante et al. | |
| 6,214,643 B1 | 4/2001 | Chiu | |
| 6,225,694 B1 * | 5/2001 | Terui | 257/704 |
| 6,249,046 B1 | 6/2001 | Hashimoto | |
| 6,262,481 B1 | 7/2001 | Wang | |
| 6,274,927 B1 | 8/2001 | Glenn | |
| RE37,554 E | 2/2002 | Brunner et al. | |
| 6,352,195 B1 | 3/2002 | Guthrie et al. | |
| 6,469,897 B2 | 10/2002 | Ho et al. | |
| 6,483,702 B1 | 11/2002 | Lofland | |
| 6,501,171 B2 | 12/2002 | Farquhar | |
| 6,504,096 B2 * | 1/2003 | Okubora | 174/521 |
| 6,538,320 B1 | 3/2003 | Tosaya et al. | |
| 6,573,590 B1 | 6/2003 | Radu et al. | |
| 6,630,743 B2 * | 10/2003 | Magnuson et al. | 257/774 |
| 6,693,748 B1 | 2/2004 | Fujimoto et al. | |
| 6,713,863 B2 | 3/2004 | Murayama et al. | |

(Continued)

FOREIGN PATENT DOCUMENTS

JP     58140931     2/1985

(Continued)

OTHER PUBLICATIONS

Xilinx, Inc.; U.S. Appl. No. 11/242,262 by Wu et al. filed Sep. 30, 2005.

*Primary Examiner*—Leonardo Andújar
(74) *Attorney, Agent, or Firm*—John J. King

(57) ABSTRACT

An integrated circuit package having a lid is disclosed. The integrated circuit package comprises a substrate having an embedded conductor exposed on a surface; a lid comprising a plurality of conductive portions; and a solder bond between the embedded conductor and the plurality of conductive portions of the lid. The substrate may comprise a recess for receiving a flange associated with the walls. The embedded conductor preferably comprises a conductor coupled to a power or ground plane of the substrate. A standoff within the walls may optionally be soldered to a contact pad on the substrate. A method of assembling an integrated circuit package is also disclosed.

9 Claims, 7 Drawing Sheets

U.S. PATENT DOCUMENTS

| | | |
|---|---|---|
| 6,762,796 B1 | 7/2004 | Nakajoh et al. |
| 6,853,068 B1 | 2/2005 | Djekic |
| 6,882,535 B2 | 4/2005 | Labanok et al. |
| 6,952,050 B2 | 10/2005 | Kwon et al. |
| 7,057,276 B2 | 6/2006 | Lin et al. |
| 2004/0174682 A1 | 9/2004 | Lin et al. |
| 2004/0238947 A1 | 12/2004 | Rumer et al. |

FOREIGN PATENT DOCUMENTS

| | | |
|---|---|---|
| JP | 60031253 A2 | 2/1985 |
| JP | 08211913 | 2/1998 |
| WO | WO 00/69239 | 11/2000 |

* cited by examiner

-- Prior Art --

-- Prior Art --

INTEGRATED CIRCUIT PACKAGE AND METHOD OF ATTACHING A LID TO A SUBSTRATE OF AN INTEGRATED CIRCUIT

FIELD OF THE INVENTION

The present invention relates generally to integrated circuit packages, and to a method of attaching a lid to a substrate of an integrated circuit package.

BACKGROUND OF THE INVENTION

Lids covering an integrated circuit die of an integrated circuit package are often used, among other functions, to encapsulate and protect the die from moisture and contaminants. Lids may also provide the additional function of a heat sink. Heat sinks are used in a variety of electronic devices to dissipate heat from the integrated circuit, preventing any failure of or damage to the integrated circuit. Heat sinks are made of a variety of heat conducting materials and are formed in a variety of shapes to adequately conduct the heat from the device. A lid is often used with an integrated circuit to reduce the heat of the semiconductor die to enable the integrated circuit to function properly. One purpose of the lid is to keep a semiconductor junction, such as a junction of the transistor, below a maximum specified operating temperature.

FIG. 1 is a top plan view of an integrated circuit package 100, shown as a flip chip package. Flip chip packages are thermally enhanced ball grid arrays (BGAs) with die facing down, and are provided with an exposed metal heat sink at the top. Because of their layout, flip chip packages lend themselves to the application of external heat sinks, either passive or active, for further heat removal efficiency. The integrated circuit package 100 comprises a region 102 having a plurality of contact pads 104 for receiving a flip chip die, and contact pads 108 for receiving other components, such as chip capacitors. As shown in the cross-sectional view of FIG. 2, a lid 201 is coupled to a substrate 202 and comprises an inner surface 203 and inner walls 204 forming a recess 206. The lid further comprises a foot portion 208 coupled to the substrate by a bonding agent 209, such as an adhesive. An integrated circuit die 210 has a plurality of contact pads 212 and corresponding solder bumps 214 which make contact with contact pads 216 of the substrate. An adhesive 218 may also be used above the integrated circuit die 210, and an underfill 220 may be used below the integrated circuit die. A solder mask 222 may also be used during the assembly process, as is well known in the art. As is also shown, the substrate is a multilayer substrate having conductors formed on a plurality of layers. A capacitor 224 on the surface of the substrate is coupled to the integrated circuit die by a conductor 226 on a layer of the substrate. The capacitor is also coupled to a ground plane 228 and a corresponding contact 230 on the bottom portion of the substrate. Other conductors 232 may extend directly from contact pads on the top of the substrate to contact pads 234 on the bottom of the substrate according to substrate artwork created for the substrate. The substrate artwork defines the various conductors so that the proper connections are made from the contact pads of the integrated circuit die (by way of the solder bumps and contact pads on the top of the substrate) to the contacts on the bottom of the substrate. Conductors 236 in various layers of the mulitlayer substrate, as well as a power contact 238, are also shown.

However, lids of integrated circuit packages often exhibit the problem of separating from the top of the package. Because the adhesion strength of the adhesive is sometimes not strong enough to secure the lid to the package, the conductive lid may come off of the package. Degradation of the adhesive may be caused by many factors, including improper dispensing of adhesive that does not produce full adhesive surface as designed, shear stresses introduced by thermal expansion/shrinkage differences at the interfaces, stresses introduced by warping, adhesive degradation due to chemical attack, etc. Excessive component handling stresses during test, assembly, or rework, such as excessive torque or pressure, may also result in separation of the lid from the package. In order to secure the lid to the substrate using an adhesive, significant area on the substrate is required for the adhesive to make a suitable bond. As more components such as chip capacitors continue to be added to substrate under the lid, the space for attaching the lid to the substrate using adhesives continues to decrease. Further, efforts are continuously being made to reduce the size of integrated circuit packages.

Accordingly, there is a need for an improved integrated circuit package and method of attaching a lid to an integrated circuit package.

SUMMARY OF THE INVENTION

An integrated circuit package having a lid is disclosed. The integrated circuit package comprises a substrate having an embedded conductor exposed on a surface; a lid comprising a plurality of conductive portions; and a solder bond between the embedded conductor and the plurality of conductive portions of the lid. The substrate may comprise a recess adjacent to the embedded conductor for receiving a flange associated with walls of the lid. The embedded conductor may comprise a conductor coupled to a power or ground plane of the substrate. A standoff within the walls may optionally be soldered to a contact pad on the substrate.

According to an alternate embodiment, an integrated circuit package comprises a substrate having an embedded conductor exposed on a surface around a perimeter. The embedded conductor of the substrate may be coupled to a power or ground plane. An integrated circuit die is coupled to contacts on the substrate. Finally, a conductive lid having walls forms a recess for receiving the integrated circuit die, wherein the walls are coupled to the exposed portions of the embedded conductor in the substrate. The conductive lid may also comprise a standoff within the walls for coupling a top portion of the lid to a contact pad on the substrate. The lid may also comprise a flange which is inserted into a recess formed by the embedded conductor to help in the placement and attachment of the lid to the substrate.

A method of attaching a lid to a substrate of an integrated circuit package is also disclosed. The method comprises steps of providing an embedded conductor having exposed portions on a surface of a substrate; attaching an integrated circuit die to contact pads on the surface of the substrate; and attaching a conductive lid to the exposed portions of the embedded conductor, such as by a solder bond. Alternatively, a conductive lid comprising a flange may be inserted into a recess of the substrate. The method may further comprise a step of coupling the embedded conductor on a top layer of a multilayer substrate to a power or ground plane on another layer of the multilayer substrate.

DETAILED DESCRIPTION OF THE DRAWINGS

Figure 3:
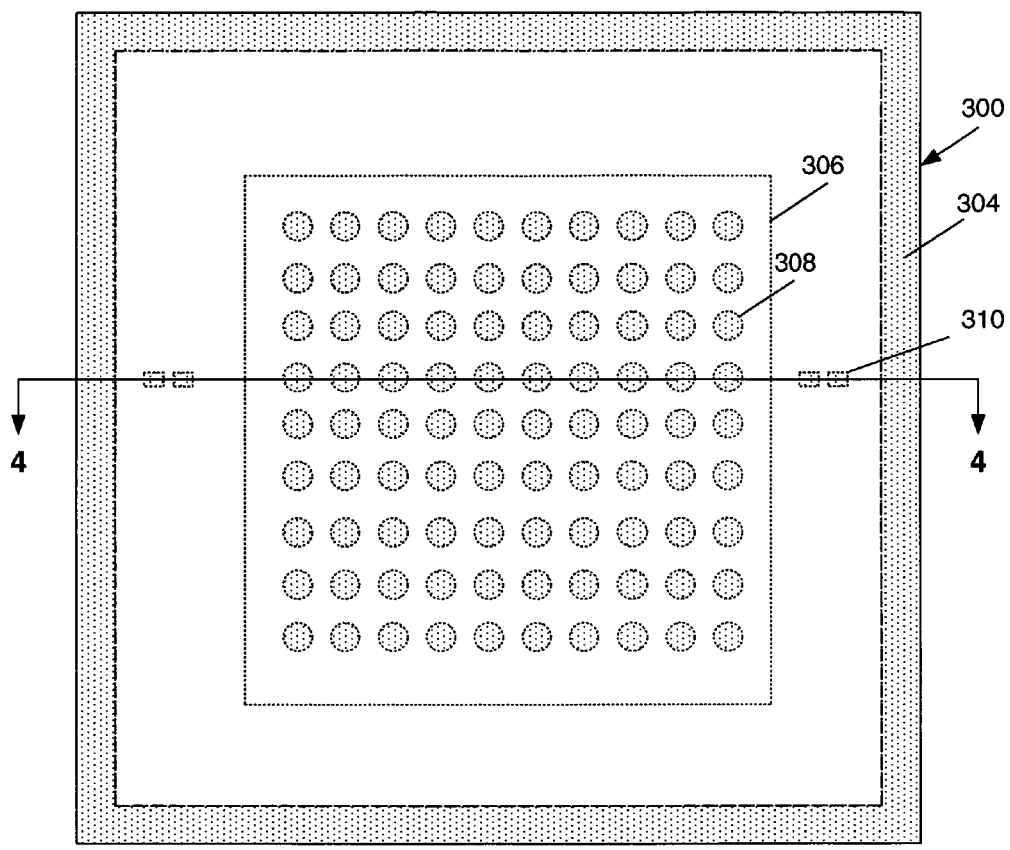
FIG. 3 is a top plan view of an integrated circuit package according to an embodiment of the present invention.
Figure 4:
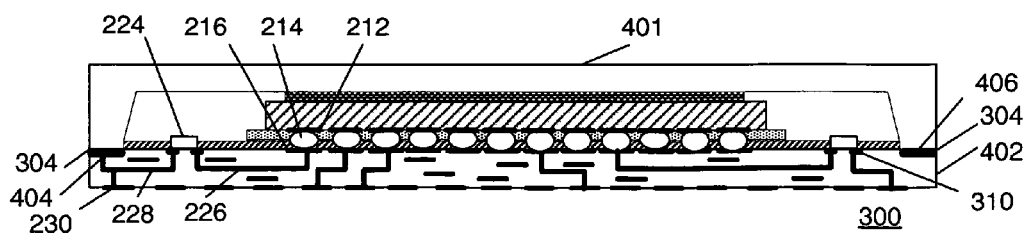
FIG. 4 is a cross-sectional view of the integrated circuit package of FIG. 3 taken at lines 4-4 according to an embodiment of the present invention.

Turning first to FIG. 3, a top plan view of an integrated circuit package 300 according to an embodiment of the present invention is shown. Shown in dashed lines, below a lid of the integrated circuit package, is a conductive layer 304 of a substrate of the integrated circuit package, as will be described in more detail in reference to FIG. 4. Also shown in dashed lines is a region 306 for receiving an integrated circuit die including corresponding contact pads 308 on the surface of the substrate. Other contacts 310 outside of the region 306 may be adapted to receive other components, such as chip capacitors.

Figure 1:
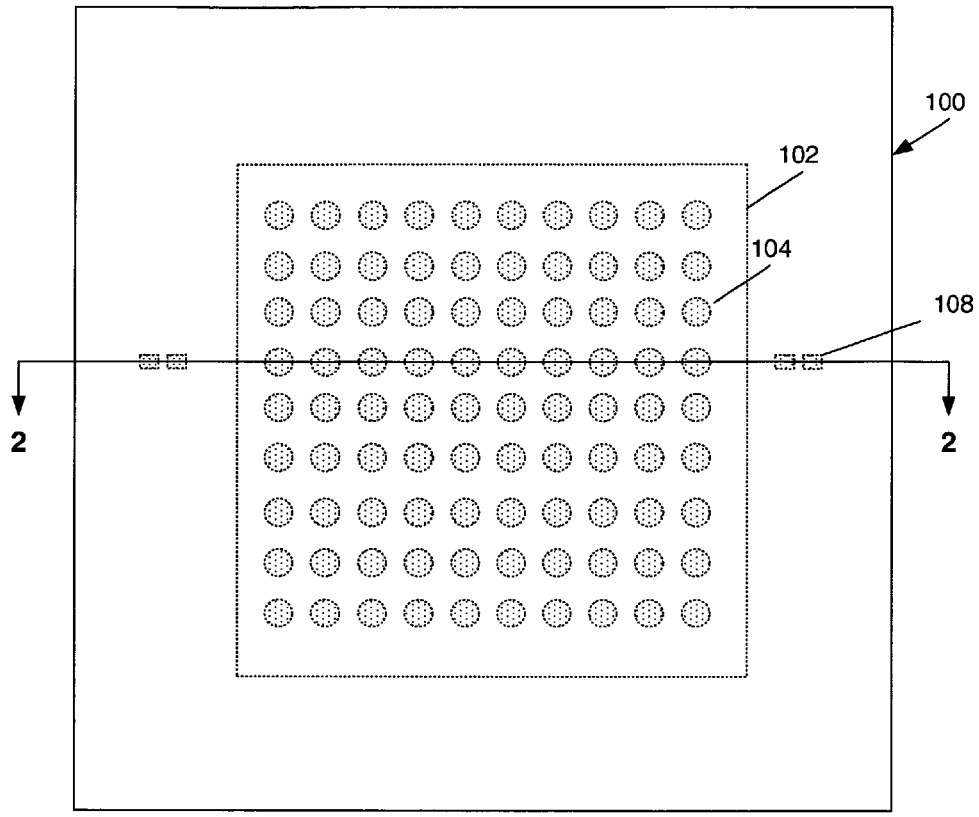
FIG. 1 is a top plan view of a conventional integrated circuit package.
Figure 2:
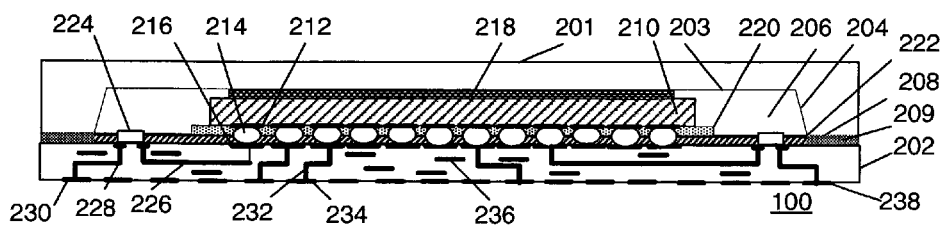
FIG. 2 is a cross-sectional view of the integrated circuit package of FIG. 1 taken at lines 2-2.

As shown in the cross-sectional view of the integrated circuit package of FIG. 3 taken at lines 4-4, a lid 401, such as a conductive lid, is coupled to conductive layer 304 of a multilayer substrate 402. In some embodiments, the lid is coupled to the conductive layer by a solder bond. When the conductive layer is exposed, it is flush with remaining surface of the substrate. In addition to the elements of the conventional integrated circuit package of FIG. 2, a conductor 404 is coupled to conductive layer 304 and ground plane 228 on another layer of the multilayer substrate. Therefore, in addition to providing a conductor to enable securing the lid to the substrate, conductive layer 304 enables the grounding of the lid by coupling the lid to a ground plane of the substrate. Alternatively, the lid may be coupled to a power plane, or some other point of the substrate. The lid 402 may comprise any conductive material such as copper. Similarly, the conductive layer 304 may comprise any conductive material commonly used for substrates, such as copper. While the lid is preferably coupled to the top layer of a multilayer substrate, it may be coupled to some other layer if the substrate is built up in a way that would expose the other layer. Finally, the foot portion 406 is preferably a portion of a wall extending around the perimeter of the substrate when positioned on the substrate, enabling encapsulating the integrated circuit and any other components on the substrate.

However, as can be seen, a foot portion 406 of the lid is generally smaller than a foot portion of a conventional lid because of the strength of a solder bond created between the lid (i.e., a bottom of the foot portion) and the conductive layer 304. The solder bond formed between a contact surface of the lid and the conductive layer of the substrate may be formed by any suitable technique for soldering two conductive elements, using any suitable solder. For example, solder may be pre-applied to a foot of the lid, or may be applied to the conductive layer 304 of the substrate. The reduced size of the foot of the lid provides for additional room under the lid or enables reducing the overall size of the package. Although a BGA package having a flip chip die is shown, the various substrates and lid combinations as well as the various methods of attaching a lid to a substrate may be used with any type of package or integrated circuit die.

Figure 5:
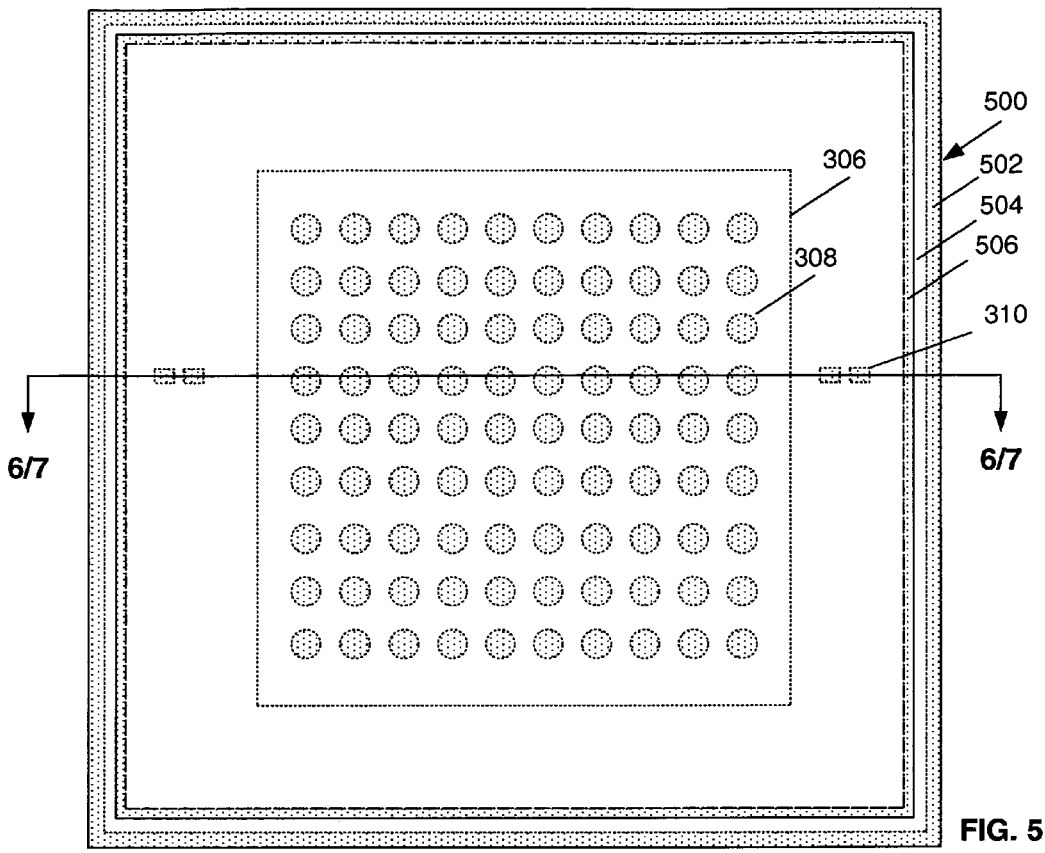
FIG. 5 is a top plan view of an integrated circuit package according to an embodiment of the present invention having a plurality of exposed conductors.
Figure 6:
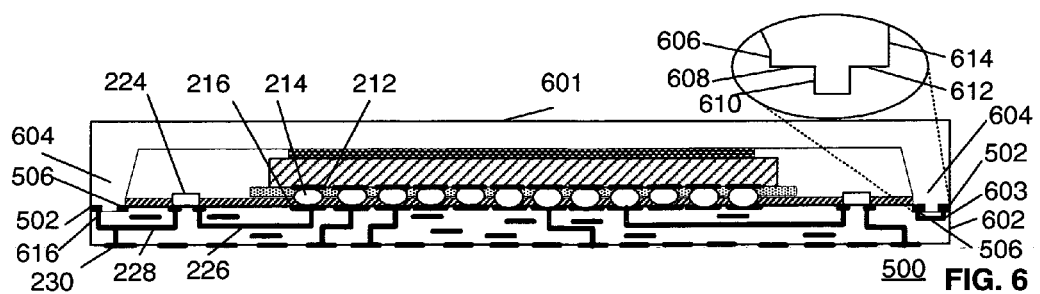
FIG. 6 is a cross-sectional view of the integrated circuit package of FIG. 5 taken at lines 6/7-6/7 according to an embodiment of the present invention.

Turning now to FIG. 5, a top plan view of an integrated circuit package 500 according to an embodiment of the present invention having a plurality of exposed conductors is shown. In particular, a first conductive layer 502 is used to form a recess 504 adjacent to a second conductive layer 506. As shown in the cross-sectional view of the integrated circuit package taken at lines 6/7-6/7 of FIG. 5, a lid 601 is coupled to a substrate 602 of the integrated circuit package by positioning a portion of the lid within the recess 504. According to the embodiment of FIG. 6, the conductive layers 502 and 506 may be electrically coupled by a conductive line 603 in another layer of the substrate. A foot portion 604 of the lid comprises an interior wall 606 adjacent to a first contact surface 608. A flange 610 has a size and shape to minimize movement of the lid when coupled to the substrate, while still allowing the flange to be easily inserted into the recess between the conductive layers of the substrate. A second contact surface 612 extending between the flange 610 and a second wall 614 provides a second surface for soldering the lid to a conductor of the substrate. As can be seen, a conductor 616 extends from the conductive layer 502 to a ground plane 228. However, it should be understood that either conductive layer 502 or 506 may be coupled to the ground plane or power plane (or any other desired point) according to the embodiment of FIG. 6.

Figure 7:
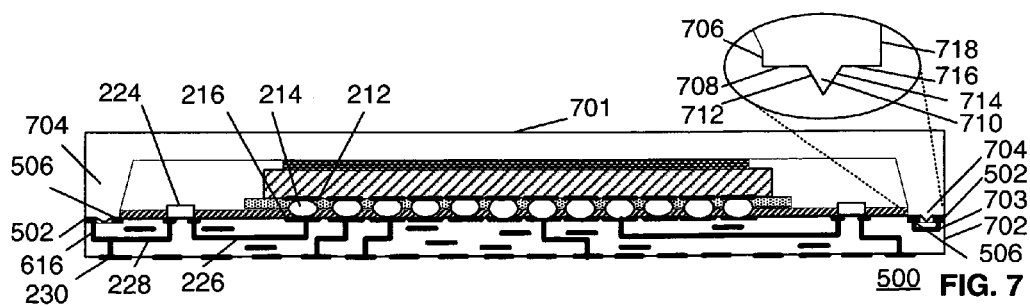
FIG. 7 is a cross-sectional view of the integrated circuit package of FIG. 5 taken at lines 6/7-6/7 according to an alternate embodiment of the present invention.

According to an embodiment shown in FIG. 7, a lid 701 coupled to a substrate 702 comprises a foot portion having a flange which enables the lid to be guided into the recess 504. In particular, foot portion 704 comprises a first wall 706 extending to a first contact surface 708 adjacent to a flange 710. The first contact surface 708 provides a surface for bonding the lid to conductive layer 506. The flange 710 also has a size and shape to enable easy guiding of the flange into the recess when the lid is place upon the substrate. For example, the flange of the embodiment of FIG. 7 comprises a first inclined portion 712 and a second inclined portion 714. If the lid is off center when positioned on the substrate, the inclined portions will help guide the flange into the recess and correctly position the lid on the substrate. A second contact surface 716 extending between the flange 710 and a second wall 718 provides a surface for soldering the lid to the conductor 502 of the substrate. The ends of the inclined portions adjacent the contact surfaces are preferably spaced apart such that the flange minimizes movement of the lid when coupled to the substrate. Although the flange is shown having inclined surfaces coming to a point and having a certain angle, the end of the flange may be a blunt end, and the sides may be at any angle. Alternatively, the flange may be any other shape, such as a half circle, for example.

Figure 8:
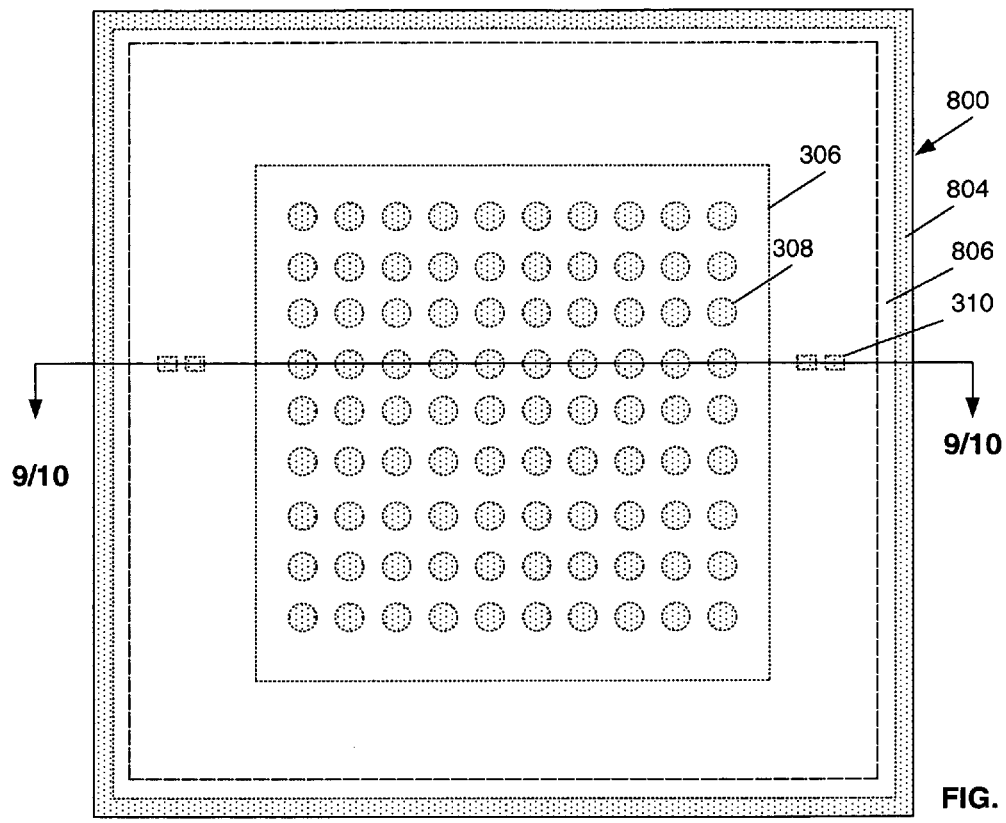
FIG. 8 is a top plan view of an integrated circuit package according to an embodiment of the present invention having a recess adjacent to an exposed conductor on the surface of a substrate.
Figure 9:
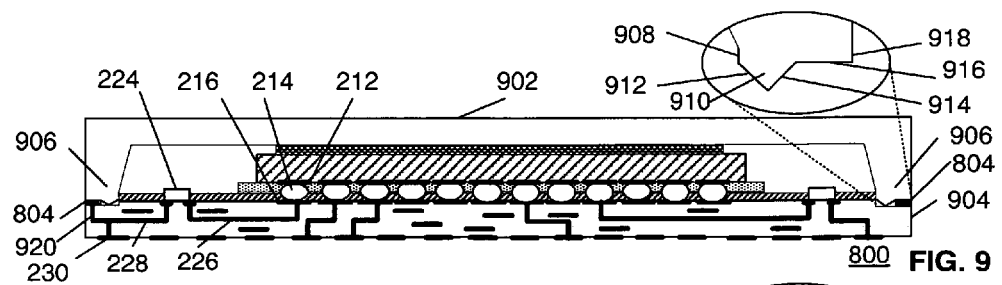
FIG. 9 is a cross-sectional view of the integrated circuit package of FIG. 8 taken at lines 9/10-9/10 according to an embodiment of the present invention.
Figure 10:
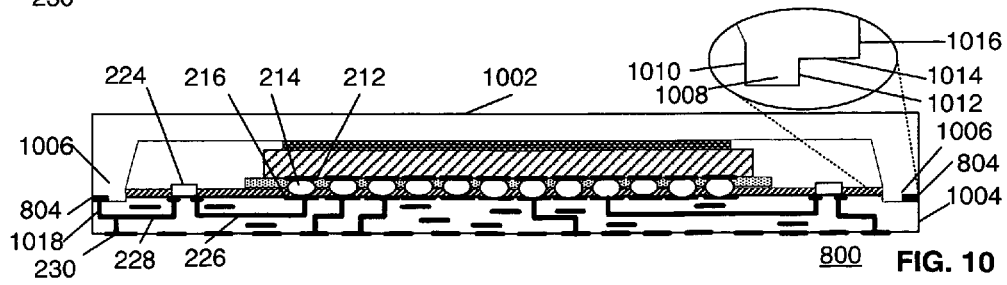
FIG. 10 is a cross-sectional view of the integrated circuit package of FIG. 8 taken at lines 9/10-9/10 according to an alternate embodiment of the present invention.

Turning now to FIG. 8, a top plan view of an integrated circuit package 800 according to an embodiment of the present invention having a recess adjacent to an exposed conductor on the surface of a substrate is shown. In particular, a single conductor 804 on a layer of the substrate is adjacent to and on an outer edge of a recess 806 in the surface of the substrate. As shown in the embodiment of FIG. 9 (showing a cross-sectional view of the integrated circuit package of FIG. 8 taken at lines 9/10-9/10), a lid 902 coupled to a substrate 904 comprises a foot portion 906 having a first wall 908 extending to a flange 910. The flange 910 is also configured to enable easy insertion of the flange into the recess 806. In particular, the flange 910 comprises a first inclined portion 912 and a second inclined portion 914. A contact surface 916 is provided between the flange 910 and a second wall 918. As described above for FIG. 7, the inclined portions will help guide the lid into the recess. A conductor 920 also couples the conductor 804 to the ground plane 228. In the embodiment of FIG. 10, a flange of the foot portion of the lid 1002 is positioned on the inner portion of the wall to fit into the recess 806 of the substrate 1004. In particular, foot portion 1006 comprises a flange 1008 extending between a first wall 1010 and a second wall 1012 and is positioned adjacent to a contact surface 1014. A conductor 1018 also couples the conductor 804 to the ground plane 228.

Figure 11:
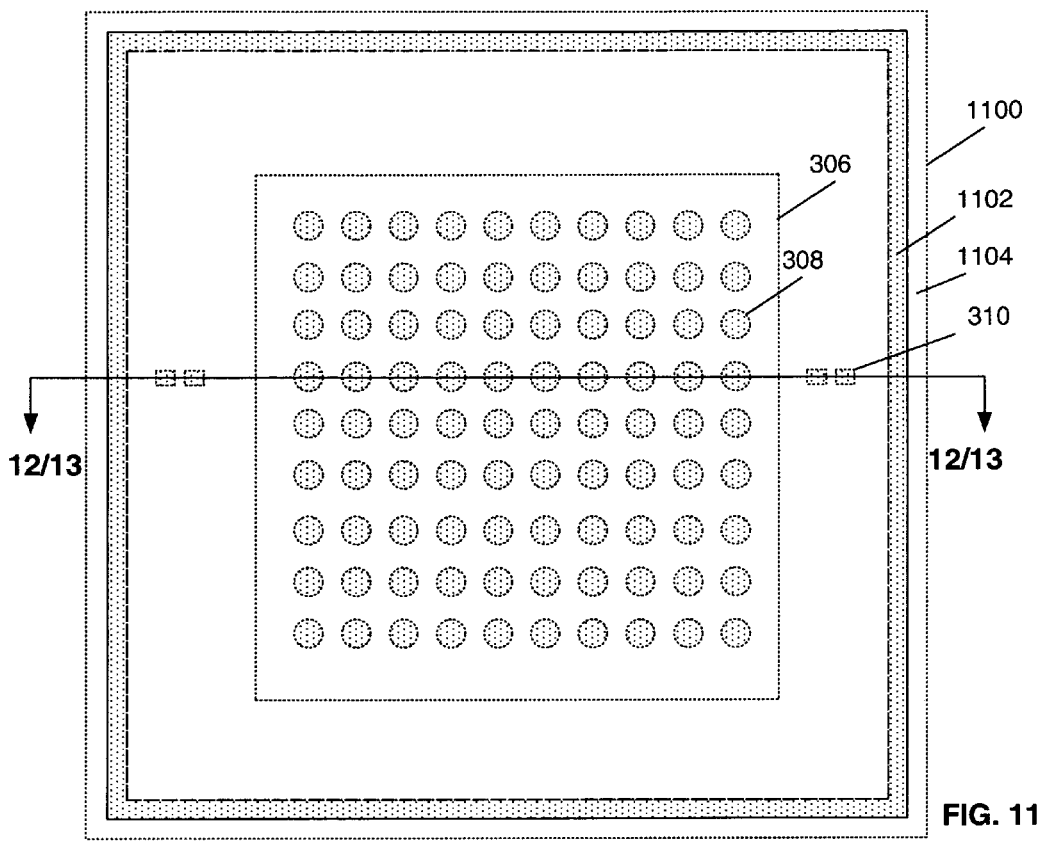
FIG. 11 is a top plan view of an integrated circuit package according to an alternate embodiment of the present invention having a recess adjacent to an exposed conductor on the surface of a substrate.
Figure 12:
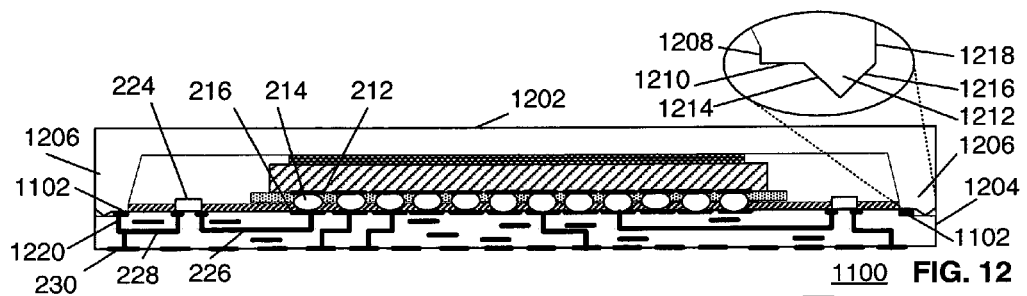
FIG. 12 is a cross-sectional view of the integrated circuit package of FIG. 11 taken at lines 12/13-12/13 according to an embodiment of the present invention.
Figure 13:
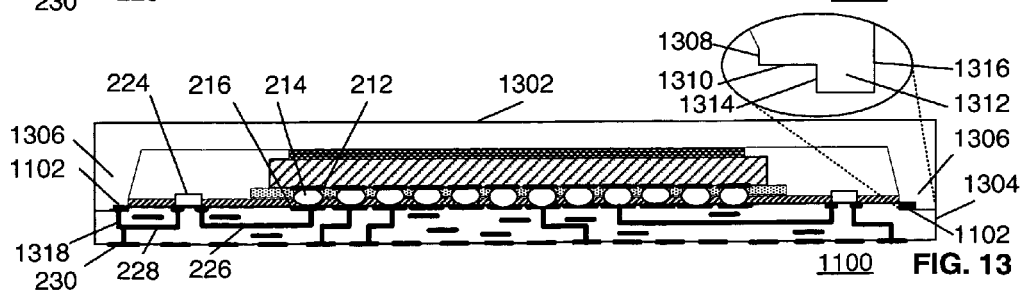
FIG. 13 is a cross-sectional view of the integrated circuit package of FIG. 11 taken at lines 12/13-12/13 according to an embodiment of the present invention.

Turning now to FIG. 11, a top plan view of an integrated circuit package 1100 according to an alternate embodiment of the present invention having a recess adjacent to an exposed conductor on the surface of a substrate is shown. In particular, a single conductor 1102 on a layer of the substrate is adjacent to and inside of the recess 1104. A shown in the embodiment of FIG. 12, a lid 1202 coupled to a substrate 1204 comprises a foot portion 1206 having a first wall 1208 extending to a contact surface 1210. The foot portion 1206 is also configured to enable easy insertion of the flange into the recess 1104. In particular, the flange 1212 comprises a first inclined portion 1214 and a second inclined portion 1216. A conductor 1220 also couples the conductor 1102 to the ground plane 228. In the embodiment of FIG. 13, a flange of the foot portion of the lid 1302 is positioned on an outer portion of the wall to fit into the recess 1104 of the substrate 1304. In particular, a wall 1308 of foot portion 1306 extends to a contact surface 1310 which is adjacent to a flange 1312. Flange 1312 extends from a first wall 1314 to a second wall 1316. Finally, a conductor 1318 also couples the conductor 1102 to the ground plane 228.

Figure 14:
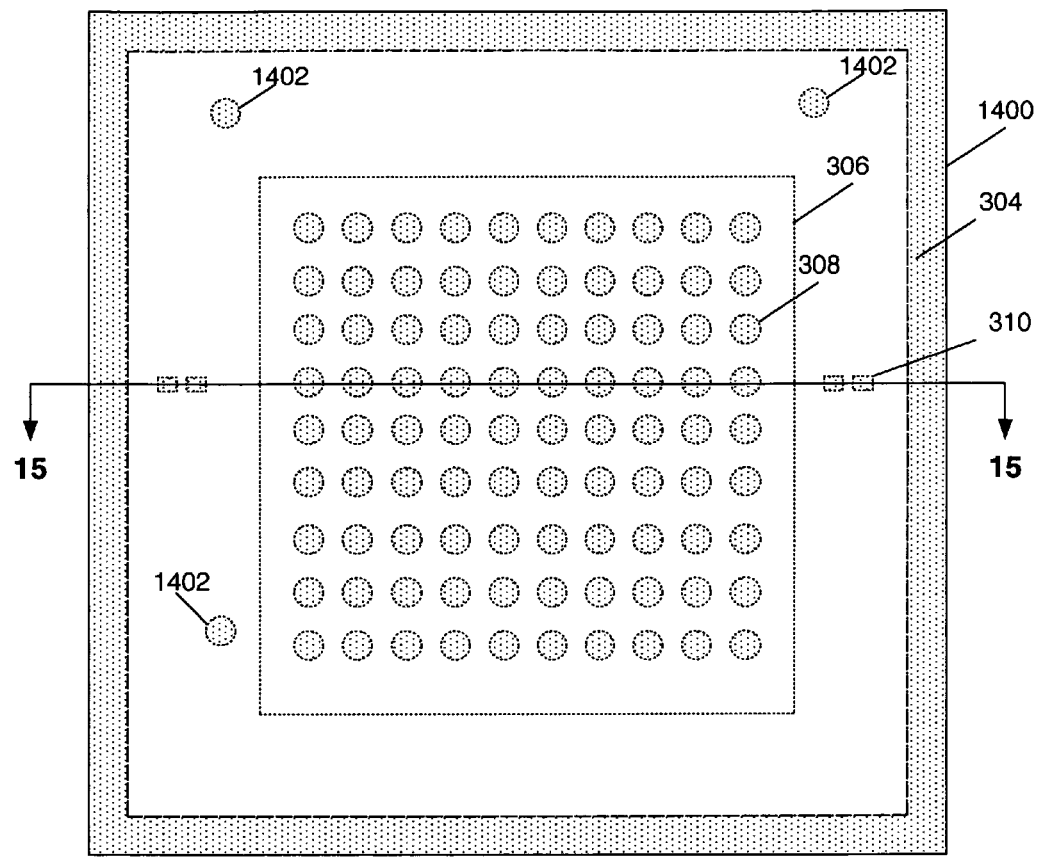
FIG. 14 is a top plan view of an integrated circuit package according to an embodiment of the present invention having standoffs attaching a lid to a substrate.
Figure 15:
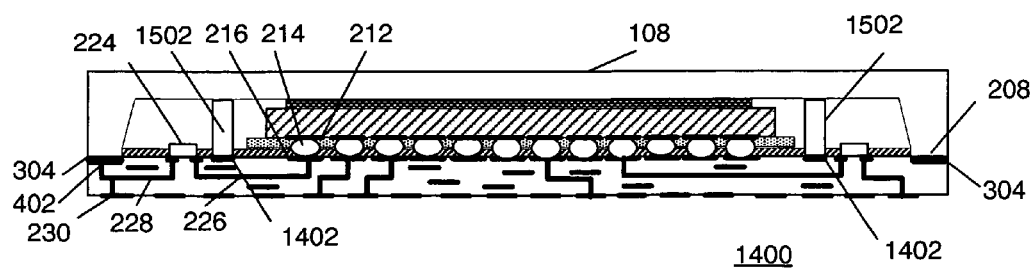
FIG. 15 is a cross-sectional view of the integrated circuit package taken at lines 15-15 of FIG. 14 according to an embodiment of the present invention.

Turning now to FIG. 14, a top plan view of an integrated circuit package according to an embodiment of the present invention shows standoffs attaching a lid to a substrate. In particular, contact pads 1402 shown in dashed lines are adapted to receive corresponding projections 1502, also commonly called standoffs, as shown in FIG. 15. The contact pads 1402 and corresponding projections 1502 are positioned between the integrated circuit die and walls of the lid 108 at locations not occupied by another device on the substrate. Because the standoffs are also soldered to contact pads of the substrate, the standoffs provide additional strength in bonding the lid to the substrate. Although three standoffs are shown, any number of standoffs may be employed. Although the embodiment of FIG. 14 is shown according to the embodiment of FIGS. 3 and 4, the standoffs described in reference to FIG. 14 may be implemented in any of the other embodiments described above.

Figure 16:
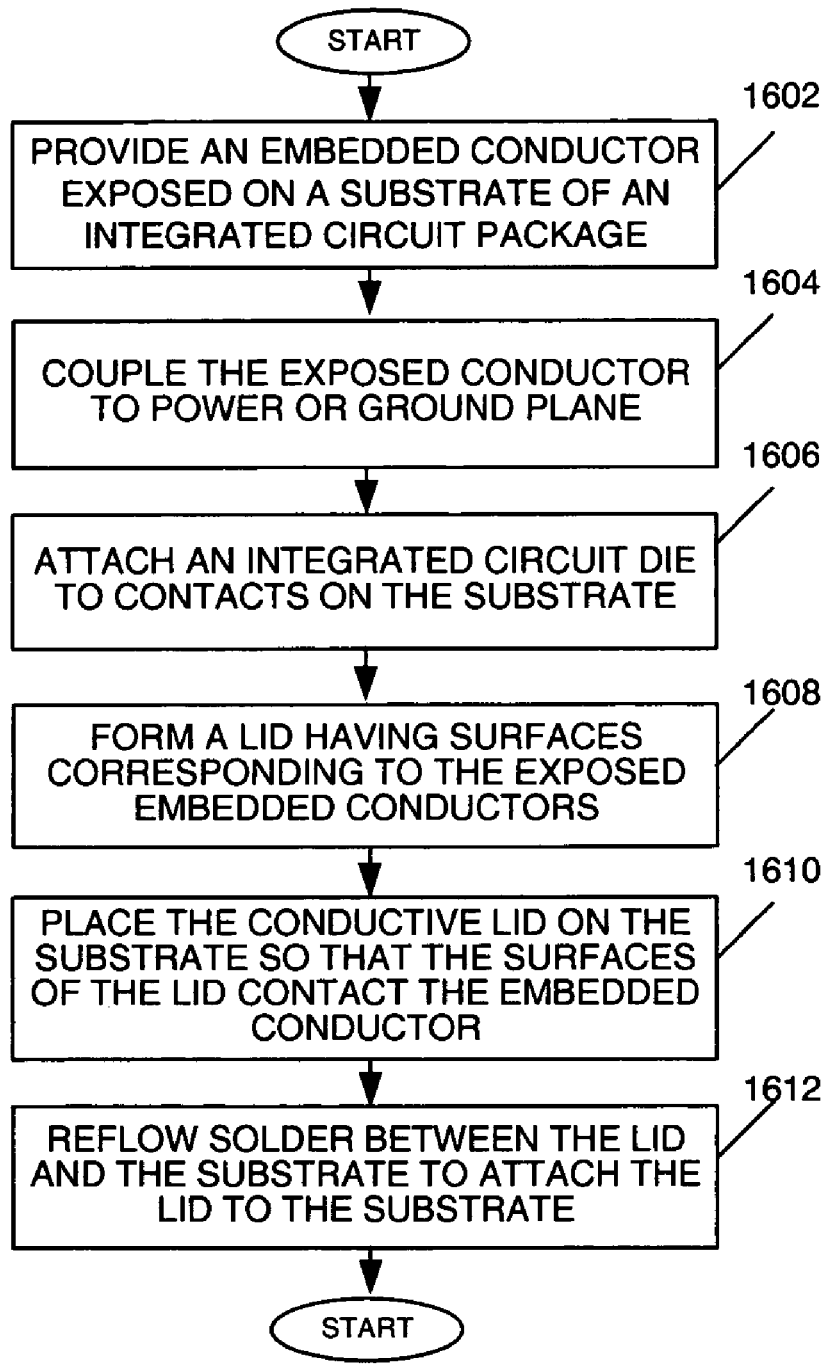
FIG. 16 is a flow chart showing a method of attaching a lid to a substrate of an integrated circuit according to an embodiment of the present invention.

Turning now to FIG. 16, a flow chart shows a method of attaching a lid to a substrate of an integrated circuit according to an embodiment of the present invention. In particular, an embedded conductor exposed on a substrate, such as a conductor on a first layer of a multilayer substrate, is provided at a step 1602. The exposed embedded conductor is preferably coupled to a power or ground plane on another layer of the substrate at a step 1604. An integrated circuit die is then attached to other contacts on the surface of the substrate at a step 1606. A lid having contact surfaces corresponding to the exposed portions of the conductor on the substrate is formed at a step 1608. The lid is then placed on the substrate so that the contact surfaces of the lid are in contact with the exposed embedded conductor at a step 1610. Finally, solder between the contact surfaces of the lid and the exposed portions of the conductor on the substrate is reflowed at a step 1612. While the method of FIG. 16 may be employed to produce an integrated circuit package according to an embodiment of FIGS. 3-15, the steps of the method of FIG. 16 may also be used to produce other integrated circuit packages.

It can therefore be appreciated that the new and novel integrated circuit package and method of attaching a lid to an integrated circuit package has been described. It will be appreciated by those skilled in the art that numerous alternatives and equivalents will be seen to exist which incorporate the disclosed invention. As a result, the invention is not to be limited by the foregoing embodiments, but only by the following claims.

I claim:

1. An integrated circuit package comprising:
   a substrate having a plurality of metal layers comprising embedded conductors, wherein an embedded conductor of a metal layer is exposed on a surface;
   a recess adjacent to said embedded conductor exposed on said surface and extending to a layer of said substrate below said embedded conductor exposed on said surface, wherein said recess and said embedded conductor exposed on said surface are positioned on an outer edge of said substrate;
   a lid comprising a plurality of conductive portions having a contact surface of a foot portion of a wall extending around the perimeter of said substrate and positioned over said embedded conductor exposed on said surface, said lid comprising a flange extending along the perimeter of said lid from said contact surface to an end, wherein said contact surface is positioned adjacent to said embedded conductor and said end of said flange is positioned within said recess and adjacent to said layer of said substrate below said embedded conductor exposed on said surface; and
   a solder bond between said embedded conductor exposed on said surface and a conductive portion of said plurality of conductive portions of said lid.

2. The integrated circuit package of claim 1 wherein said embedded conductor comprises a single embedded conductor exposed substantially around a perimeter of the substrate.

3. The integrated circuit package of claim 1 wherein said embedded conductor comprises a conductor coupled to a power or ground plane of said substrate.

4. The integrated circuit package of claim 1 wherein said embedded conductor comprises a pair of conductors forming said recess for receiving said flange.

5. The integrated circuit package of claim 1 further comprising a standoff within said walls, said standoff being soldered to a contact pad on said substrate.

6. An integrated circuit package comprising:
- a substrate having a plurality of metal layers comprising embedded conductors, wherein an embedded conductor of a metal layer is exposed on a surface around a perimeter;
- a recess adjacent to said embedded conductor exposed on said surface and extending to a layer of said substrate below said embedded conductor exposed on said surface, wherein said recess and said embedded conductor exposed on said surface are positioned on an outer edge of said substrate;
- an integrated circuit die coupled to contact pads of said metal layer of said substrate; and
- a conductive lid having walls comprising a contact surface of a foot portion and forming a recess for receiving said integrated circuit die, said walls comprising a flange extending along the perimeter of said lid from said contact surface to an end, wherein said contact surface is positioned adjacent to said embedded conductor and said end of said flange is positioned within said recess and adjacent to said layer of said substrate below said embedded conductor exposed on said surface, said walls extending around said perimeter of said substrate and said contact surface being soldered to said exposed embedded conductor in said substrate.

7. The integrated circuit package of claim 6 wherein said conductive lid further comprises a standoff within said walls and coupling a top portion to a contact pad on said substrate.

8. The integrated circuit package of claim 6 wherein said embedded conductor is a first embedded conductor; and
- wherein said substrate comprises a second embedded conductor forming said recess with said first embedded conductor.

9. The integrated circuit package of claim 6 wherein said embedded conductor of said substrate is coupled to a power or ground plane of said substrate.

* * * * *